United States Patent
Shinriki et al.

(10) Patent No.: US 6,953,731 B2
(45) Date of Patent: Oct. 11, 2005

(54) FABRICATION PROCESS OF A SEMICONDUCTOR DEVICE

(75) Inventors: Hiroshi Shinriki, Nirasaki (JP); Kazumi Kubo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/457,450

(22) Filed: Jun. 10, 2003

(65) Prior Publication Data

US 2003/0236001 A1 Dec. 25, 2003

(30) Foreign Application Priority Data

Jun. 19, 2002 (JP) ......................................... 2002-178930

(51) Int. Cl.[7] ............................................. H01L 21/336
(52) U.S. Cl. ...................... 438/287; 438/785; 438/790
(58) Field of Search ........................... 438/3, 240, 287, 438/785–786, 790

(56) References Cited

U.S. PATENT DOCUMENTS 6,674,138 B1 * 1/2004 Halliyal et al. ............. 257/411
6,767,795 B2 * 7/2004 Ahn et al. ................... 438/287
2002/0028570 A1 * 3/2002 Vaartstra ..................... 438/592
2002/0167005 A1 * 11/2002 Yu et al. ....................... 257/43

FOREIGN PATENT DOCUMENTS

| JP | 2001-015739 | 1/2001 |
| JP | 2002-100627 | 4/2002 |
| JP | 2002-167672 | 6/2002 |
| WO | WO 00/36640 | 6/2000 |

* cited by examiner

Primary Examiner—H. Jey Tsai
(74) Attorney, Agent, or Firm—Crowell & Moring LLP

(57) ABSTRACT

A method of fabrication a semiconductor device includes the steps of forming an insulation film containing Si and oxygen on a silicon substrate, and depositing a metal oxide film on the insulation film by a chemical vapor deposition process that uses a metal organic source material, wherein the step of depositing the metal oxide film is conducted such that the metal oxide film takes a crystalline state immediately after the deposition step.

11 Claims, 10 Drawing Sheets

FABRICATION PROCESS OF A SEMICONDUCTOR DEVICE

BACKGROUND OF THE INVENTION

The present invention generally relates to semiconductor devices and more particularly to a ultrafine high-speed semiconductor device having a high dielectric or so-called high-K dielectric film.

In recent ultrahigh-speed semiconductor devices, the gate length of 0.1 μm or less is becoming possible with advancement of ultrafine processing technology. Generally, the operational speed of a semiconductor device is improved with device miniaturization, while there is a need in such highly miniaturized semiconductor device to decrease the thickness of the gate insulation film with reduction of gate length caused by device miniaturization.

In the case the gate length has become 0.1 μm or less, on the other hand, it becomes necessary to set the thickness of the gate insulation film to 1–2nm or less in the case an $SiO_2$ film is used for the gate insulation film. In such a very thin gate insulation film, on the other hand, there occurs increase of tunneling current, and as a result, there arises the problem of increase of gate leakage current.

In view of the situations noted above, there has been a proposal to use a high-K dielectric material, such as $Ta_2O_5$, $Al_2O_3$, $ZrO_2$, $HfO_2$, $ZrSiO_4$, $HfSiO_4$, and the like, characterized by a small $SiO_2$- equivalent thickness even in the case the film has a large physical thickness, for the gate insulation film. By using such a high-K dielectric film, it becomes possible to use a physical thickness of about 10 nm even in the case of ultrahigh-speed semiconductor devices in which the gate length is reduced to 0.1 μm or less, and the gate leakage current caused by tunneling effect is suppressed.

In a semiconductor device that uses such high-K dielectric film for the gate insulation film, it is preferable to form the high-K dielectric film directly on the Si substrate for reducing the $SiO_2$ equivalent thickness of the insulation film. On the other hand, in the case such a high-K dielectric film is formed directly on a Si substrate, there is caused diffusion of metal element from the high-K dielectric film into the Si substrate, and there is caused the problem of carrier scattering in the channel region.

From the viewpoint of improving the carrier mobility in the channel region, it is preferable to interpose a very thin base oxide film between the high-K gate oxide film and the Si substrate with the thickness of 1 nm or less, preferably 0.8 nm or less. This base oxide film has to be very thin. Otherwise, the effect of using the high-K dielectric film for the gate insulation film would be canceled out.

FIGS. 1A–1C show a conventional fabrication process of a semiconductor device that has a high-K dielectric gate insulation film.

Referring to FIG. 1A, a base oxide film 12 of a very thin $SiO_2$ film preferably having a thickness of 1 nm or less is formed on a silicon substrate 11 for example by a radical oxidation processing that uses ultraviolet-excited oxygen radicals. Next, in the step of FIG. 1B, a metal oxide film 13 of $HfO_2$ or $ZrO_2$ is formed on the base oxide film 12 by an atomic layer deposition (ALD) process, metal organic chemical vapor deposition (MOCVD) process, or the like.

In the step of FIG. 1A, the radical oxidation processing may be conducted according to the process described in Japanese Laid-Open Patent Publication 2002-100627, which is incorporated herein as reference. As a result of oxidation of the silicon substrate by the ultraviolet-excited radicals, it becomes possible to form the base oxide film having a thickness corresponding to 2–3 molecular layers stably and with excellent reproducibility. Further, by using the foregoing method disclosed in the Japanese Laid-Open Patent Publication 2002-100627, it is also possible to obtain a silicon oxynitride film for the base oxide film 12 by introducing nitrogen atoms into the extremely thin silicon oxide film thus formed.

In the step of FIG. 1B, the deposition of the metal oxide film 13 may be conducted by the ALD process disclosed in Japanese Laid-Open Patent Publication 2002-151489 or by an MOCVD process.

Meanwhile, it is necessary that the metal oxide film 13 formed as a high-K dielectric film is crystallized, contrary to the case of amorphous $SiO_2$ film, in order to exploit the performance of the high-K dielectric film. Thus, it has been practiced to apply a thermal annealing process to the structure obtained in the step of FIG. 1B as represented in FIG.1C for crystallizing the metal oxide film 13. As the metal oxide film 12 is formed on the amorphous base oxide film 12, the metal oxide film 13 becomes a polycrystalline body when crystallized. Such crystallized metal oxide film 13 is used for the high-K dielectric gate insulation film of high-speed semiconductor devices.

As explained previously, it is required that the base oxide film 12 formed at the interface between the high-K dielectric gate insulation film and the silicon substrate has as small thickness as possible. In the case the thickness of the base oxide film 12 is increased, the effect of using the high-K gate insulation film 13 is canceled out.

Meanwhile, in the deposition step of the metal oxide film 13 of FIG. 1B, it should be noted that the process is conducted in an oxygen atmosphere particularly in the case an MOCVD process is used. Thus, in the case the substrate temperature is high at the time of the deposition process, there is a substantial risk that the thickness of the base oxide film may increase as a result of oxidation of the substrate. Further, the thickness of the base oxide film 12 may increase also in the crystallization annealing step of FIG. 1C.

Further, in the step of FIG. 1C, there is caused grain growth in the microcrystals in the metal oxide film 13 at the time of crystallization of the metal oxide film 13, while such a grain growth caused in the film 13 may invite the problem of formation of irregular or unstable interface with respect to the underlying base oxide film. Formation of such irregular or unstable interface invites the problem of increase of gate leakage current.

SUMMARY OF THE INVENTION

Accordingly, it is a general object of the present invention to provide a novel and useful fabrication process of a semiconductor device wherein the foregoing problems are eliminated.

Another and more specific object of the present invention is to provide a fabrication process of a semiconductor device having a high-K dielectric gate insulation film wherein the film thickness increase of the high-K gate insulation film is effectively avoided during the crystallization process of the high-K dielectric gate insulation film.

Another object of the present invention is to provide a fabrication process of a semiconductor device having a high-K dielectric gate insulation film wherein the grain growth of metal oxide microcrystals in the high-K dielectric gate insulation film is successfully suppressed during the crystallization process of the high-K dielectric gate insulation film.

Another object of the present invention is to provide a fabrication process of a semiconductor device having a high-K dielectric gate insulation film, wherein the film thickness of the high-K dielectric gate insulation film is effectively controlled.

Another object of the present invention is to provide a method of fabrication a semiconductor device, comprising the steps of:

forming an insulation film containing Si and oxygen on a silicon substrate; and depositing a metal oxide film on said insulation film by a chemical Vapor deposition process that uses a metal organic source material, wherein said step of depositing said metal oxide film is conducted such that said metal oxide film takes a crystalline state immediately after deposition.

According to the present invention, the metal oxide film constituting the high-dielectric gate insulation film is obtained in the crystalline state immediately after the deposition thereof. Thereby, the grain growth in the metal oxide film is suppressed, and the grain diameter of the metal oxide crystals does not exceed 10 nm after the crystallization step. Further, such a deposition of the metal oxide film does not cause substantial increase of film thickness of the base oxide film. Particularly, there is caused segregation of nitrogen in the metal oxide film to the gain boundary in the case a material containing an amide group is used for the metal organic source. It is believed that nitrogen thus segregated to the grain boundary suppresses migration of atoms along the grain boundary.

Other objects and further features of the present invention will become apparent from the following detailed description when read in conjunction with the attached drawings.

DETAILED DESCRIPTION OF THE PREFERRED EMBODIMENTS

[First Embodiment]

Figure 2:
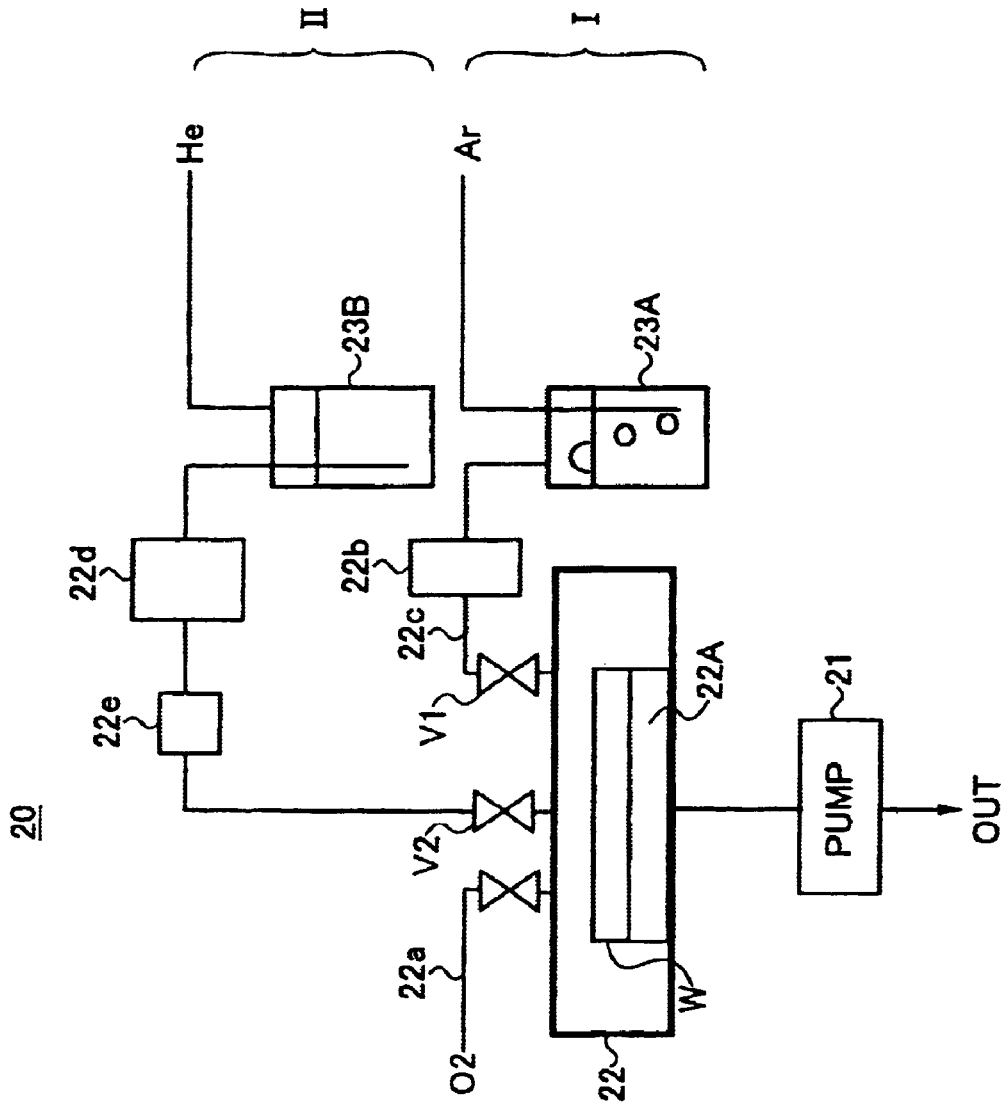
FIG. 2 is a diagram showing the construction o an MOCVD apparatus used in a first embodiment of the present invention.

FIG. 2 shows the construction of an MOCVD apparatus 20 used in the present invention.

Referring to FIG. 2, the MOCVD apparatus 20 includes a reaction vessel 22 evacuated by a pump 21, and a stage 22A is provided inside the reaction vessel 22 for supporting a substrate W.

In the MOCVD apparatus 20 of FIG. 2, there is provided a line 22a for supplying an oxygen gas to the reaction vessel 22, and there is further provided a source supplying system I that supplies a liquid metal organic source such as $Hf[N(C_2H_5)_2]_4$ held in a bubbler 23A to the reaction vessel 22 via a gaseous source controller 22b and a line 22c. Further, the MOCVD apparatus 20 includes a source supplying system II that supplies a liquid metal organic source such as $Hf[N(C_2H_5)_2]_4$ held in a bottle 23B to the reaction vessel 22 via a liquid flow controller 22d and a vaporizer 22e. The source supplying system I and the source supplying system II are switched by controlling the valves V1 and V2.

Figure 3:
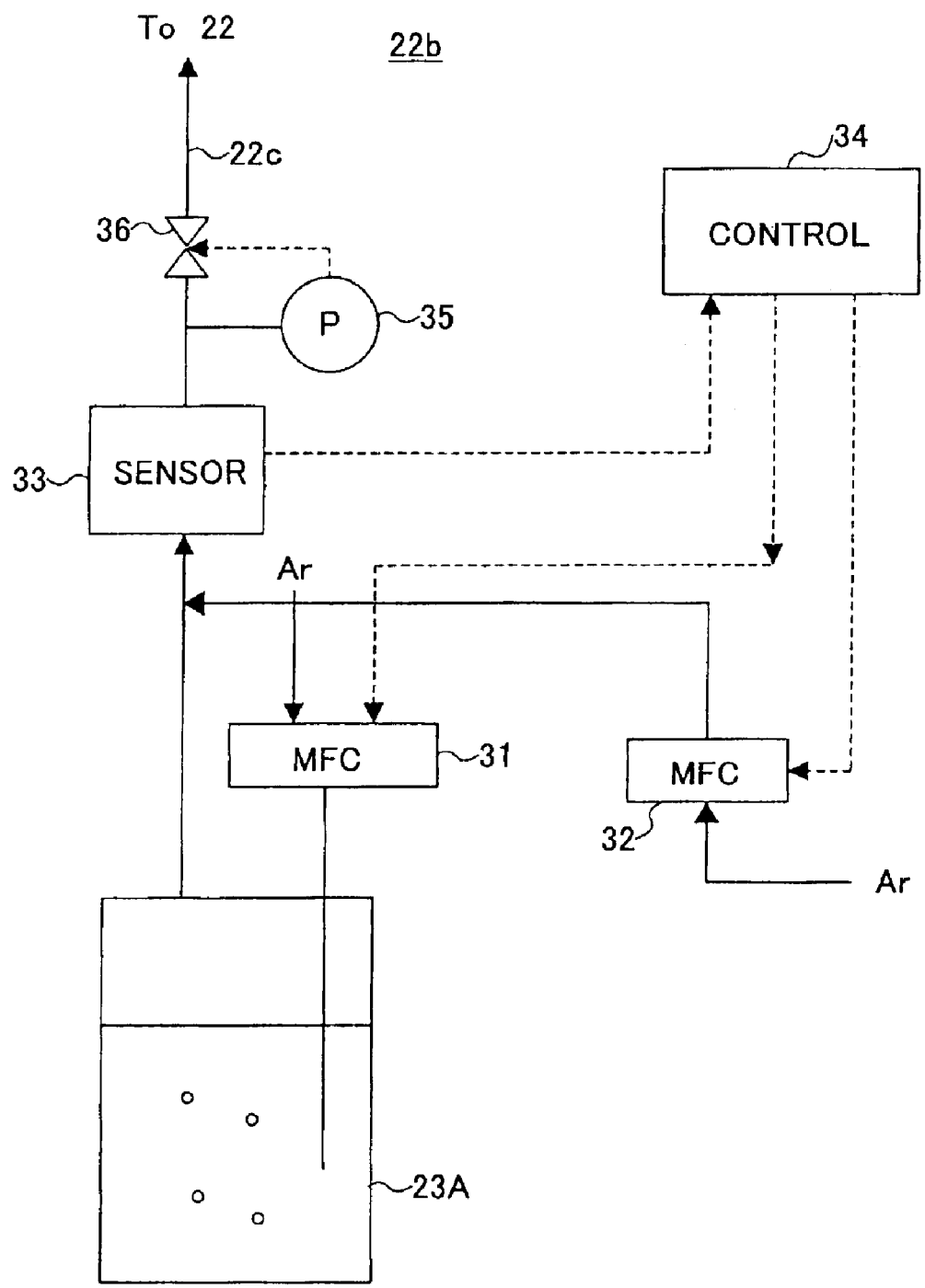
FIG. 3 is a diagram showing a part of the MOCVD apparatus of FIG.2 in detail.

FIG. 3 shows the construction of the gaseous source controller 22b of the source supplying system.

Referring to FIG. 3, the gaseous source controller 22b includes a mass flow controllers (referred to hereinafter as MFC) 31 and 32 supplied with an Ar gas, and the MFC 31 supplies the Ar gas supplied thereto further to the bubbler 23A holding therein the organic metal source, as a carrier gas.

In the bubbler 23A, there is formed a vapor of metal organic source, and the vapor of the metal organic source thus formed is supplied to a concentration level sensor 33 together with the Ar carrier gas from the MFC 32.

The concentration level sensor 33 measures the concentration of the metal organic source with respect to the Ar carrier gas supplied thereto and produces an output signal indicative of the result. Thereby, the concentration level sensor 33 supplies the output signal to a control unit 34. The control unit 34, in turn, produces first and second control signals in response to the output signal of the concentration level sensor 33 according to a predetermined program and supplies these to the MFC 31 and MFC 32, respectively. With this, the concentration ratio of the metal organic source as measured in the concentration level sensor 33 is controlled to a predetermined value with respect to the carrier gas. The gaseous source in which the concentration ratio of the metal organic source thus controlled is then supplied to the reaction vessel 22 via the line 22c after setting the pressure to a predetermined pressure by using a manometer 35 and a valve 36.

Figure 4:
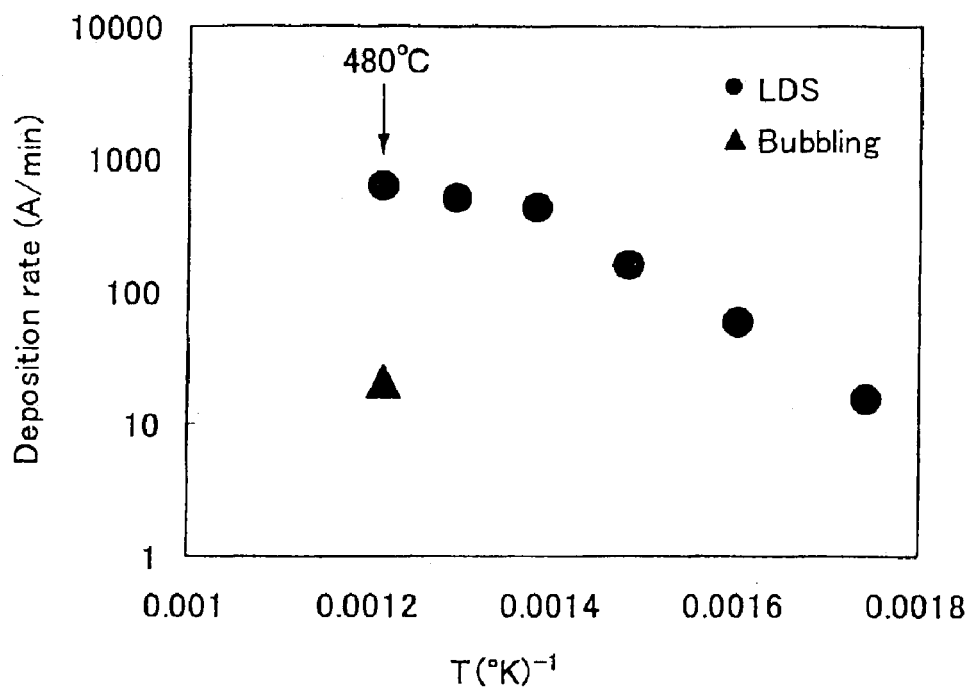
FIG. 4 is a diagram showing the relationship between the deposition rate of an $HfO_2$ film and the substrate temperature.

FIG. 4 shows the deposition rate of an $HfO_2$ film for the case the $HfO_2$ film is deposited on a silicon substrate in the MOCVD apparatus 20 of FIG. 2 at the substrate temperature of 480° C. while using $Hf[N(C_2H_5)_2]_4$ for the source material, wherein FIG. 4 compares the case in which the source supplying system I of FIG. 2 is used and the case in which the source supplying system II is used.

Referring to FIG. 4, it can be seen that the deposition rate increases with the substrate temperature used for the deposition process when the source supplying system II is used. Thus, it can be seen that a very large deposition rate in the order of 100 nm per minute is achieved in the case the deposition is conducted at 480° C. At such a very large deposition rate, it is difficult to form the metal oxide film of several manometer thickness with high precision.

In the case of using the source supplying system I that uses the bubbler 23A, on the other hand, it can be seen that the deposition rate is in the order of 1 nm per minute even the substrate temperature of 480° C. is used at the time of the deposition process. This means that it is possible to form a very thin oxide film with high precision according to such a process.

Figure 5:
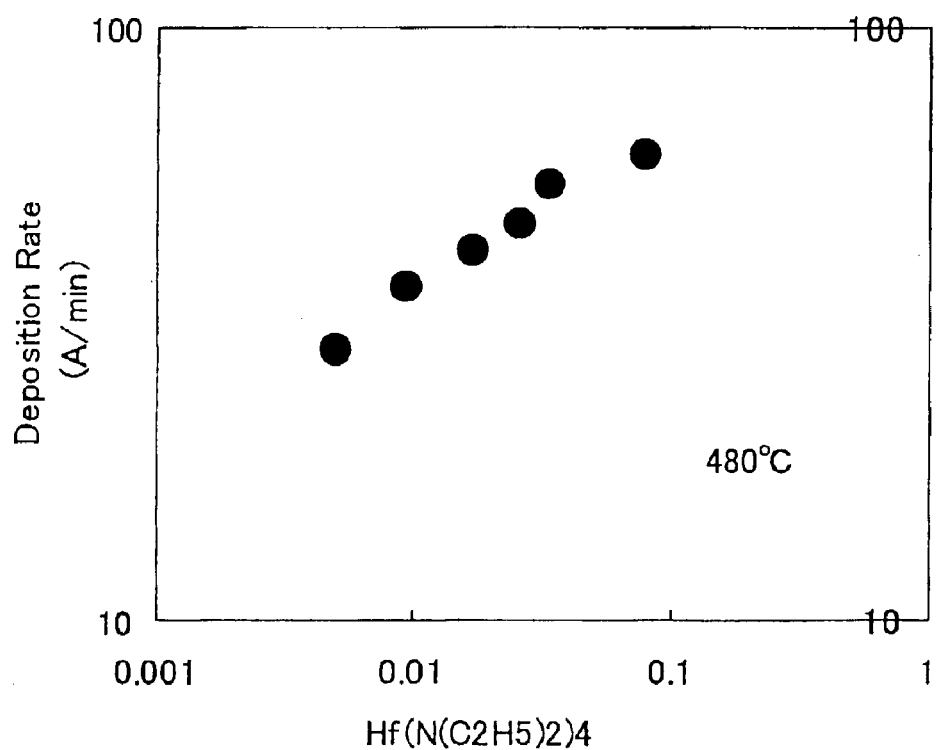
FIG. 5 is a diagram showing the relationship between the deposition rate of an $HfO_2$ film and the partial pressure of the gaseous source material.

FIG. 5 shows the relationship between the Hf[N(C$_2$H$_5$)$_2$]$_4$ partial pressure in the gaseous source supplied to the reaction vessel 22 via the line 22c and the deposition rate on the substrate. It should be noted that the relationship of FIG. 5 is for the case the substrate temperature is set to 480° C.

Referring to FIG. 5, it can be seen that the deposition rate of the HfO$_2$ film on the substrate is decreased with the reduction of the Hf[N(C$_2$H$_5$)$_2$]$_4$ partial pressure in the case the source supplying system I of FIG. 2 is used, and that it is possible to control the film formation rate of the HfO$_2$ film on the substrate W by controlling the Hf[N(C$_2$H$_5$)$_2$]$_4$ partial pressure while using the gaseous source controller 22b shown in FIG. 3.

Figure 6:
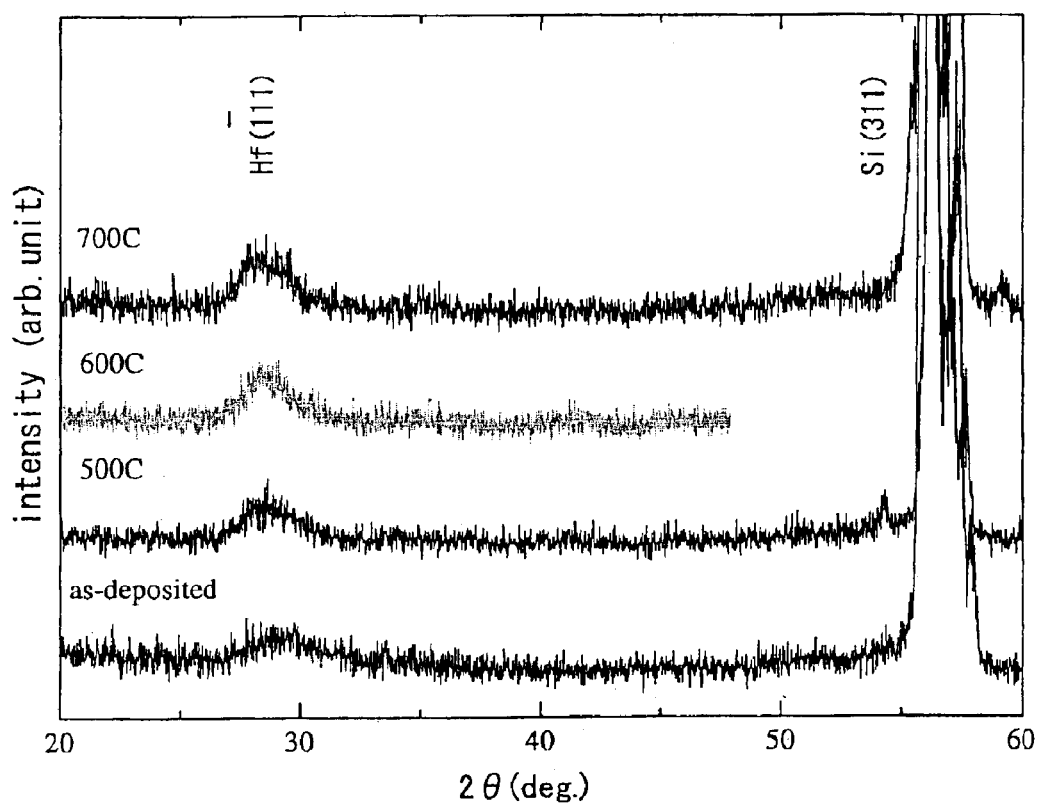
FIG. 6 is a diagram showing the X-ray diffraction pattern of an $HfO_2$ film obtained by the first embodiment of the present invention.

FIG. 6 shows the X-ray diffraction pattern of the HfO$_2$ film thus formed immediately after the deposition (as-deposited state). FIG. 6 also shows the X-ray diffraction pattern for the case the HfO$_2$ film thus obtained is subjected to a thermal annealing process conducted in a nitrogen atmosphere at various temperatures between 500–700° C. In the experiment of FIG. 6, it should be noted that the silicon substrate surface is covered with a base oxide film of SiO$_2$ or SiON according to the process of Japanese Laid-Open Patent Publication 2002-100627 with a thickness of about 0.8 nm, after conducting an HF cleaning process. Thus, the deposition of the HfO$_2$ film is conducted on the base oxide film thus formed. Thereby, the deposition of the HfO$_2$ film is conducted by using Hf[N(C$_2$H$_5$)$_2$]$_4$ as the source material as explained before, while setting the substrate temperature to 480° C. during the deposition process.

Referring to FIG. 6, it can be seen that the HfO$_2$ film shows the diffraction peak of Hf(111) even in the state immediately after the deposition, indicating that the film is in the crystallized stated.

Figure 1C:
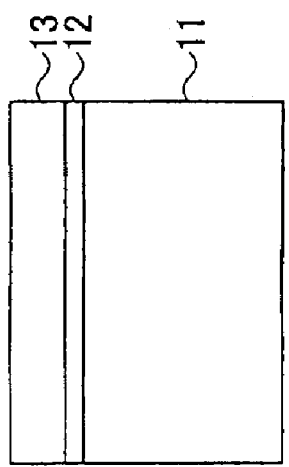
FIGS. 1A–1C are diagrams showing a conventional fabrication process of a high-K dielectric gate insulation film.
Figure 1B:
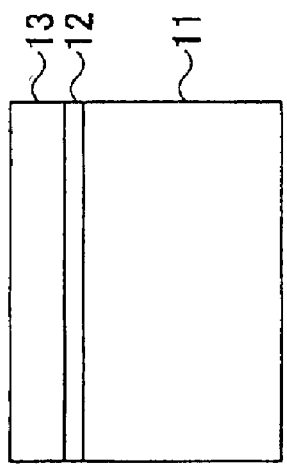
Figure 1A:
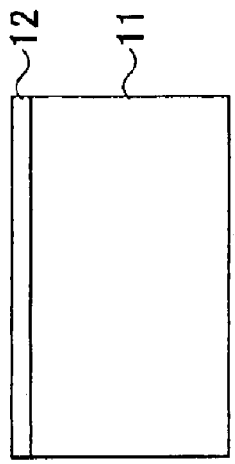

In the case a thermal annealing process is applied to the HfO$_2$ film thus formed in correspondence to the step of FIG. 1C, the height of the diffraction peak of Hf(111) increases slightly, indicating that there occurs a progress of crystallization. However, the increase of the diffraction peak strength is not very conspicuous and it is believed that the microstructure inside the HfO$_2$ film does not change very much even when such a thermal annealing process is conducted. In fact, the measurement of grain diameter distribution of the HfO$_2$ crystals in the film reveals the fact that the average grain size immediately after deposition at 480° C. is about 4.7 nm, while the average grain size becomes about 8.5 nm after a thermal annealing process at 500° C., about 7.5 nm after a thermal annealing process at 600° C., and about 6.3 nm after a thermal annealing process at 700° C. Taking into consideration the measurement error, the foregoing results indicate that there is caused no substantial grain growth beyond the grain diameter of 10 nm in the HfO$_2$ film even when such a thermal annealing process is conducted.

Figure 7A:
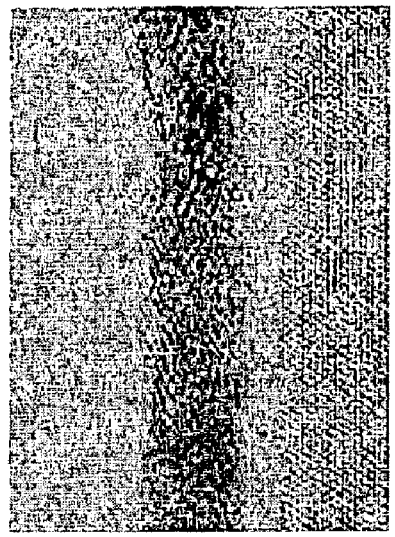
FIGS. 7A–7C are diagrams showing a cross-sectional TEM image of a specimen obtained by the first embodiment of the present invention and containing an $HfO_2$ film.
Figure 7B:
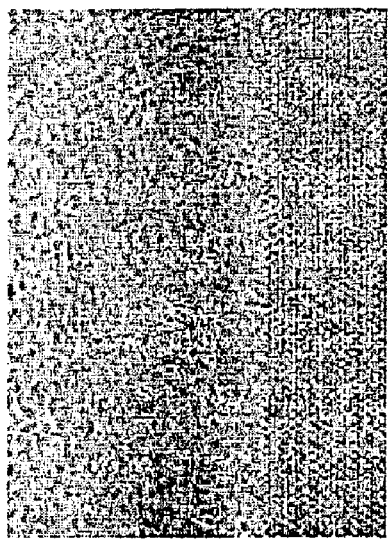

FIG. 7A shows the result of transmission microscopic observation conducted on the cross-section of the specimen immediately after the deposition of the HfO$_2$ film, while FIG. 7B shows the result of transmission microscopic observation conducted on the cross-section of the HfO$_2$ film after a thermal annealing process at 700° C. in a nitrogen ambient. It should be noted that FIGS. 7A and 7B are represented in the same scale. It can be seen that individual silicon atoms are resolved in the silicon substrate.

Referring to FIG. 7A, the SiO$_2$ base oxide film has a thickness of about 1.3 nm immediately after the formation of the HfO$_2$ film, while this means that there has been caused a film thickness increase of about 0.5 nm with respect to the initial film thickness (0.8 nm).

In contrast, the film thickness of the SiO$_2$ base oxide film becomes about 0.9 nm in FIG. 7B, indicating that there has been caused another film thickness increase of about 0.1 nm with respect to the state of FIG. 7A.

Figure 7C:
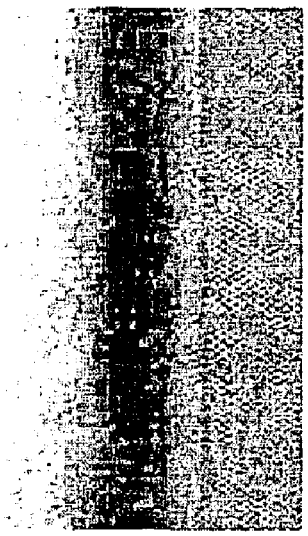

Further, FIG. 7C shows the cross-section of the specimen in which the HfO$_2$ film is formed on a SiON base film of 0.8 nm thickness at 480° C., followed by a thermal annealing process conducted in a nitrogen atmosphere at 500° C. In this case, it was confirmed that there is caused no substantial film thickness increase in the SiON base film.

Thus, according to the present invention, a crystallized HfO$_2$ film is obtained immediately after the deposition in the case the HfO$_2$ film is deposited by an MOCVD process at the substrate temperature of 480° C. while using the Hf[N (C$_2$H$_5$)$_2$]$_4$ for the source material. Further, the HfO$_2$ film thus obtained causes no substantial grain growth of the HfO$_2$ crystals when it is subjected to a thermal annealing process. Further, there is caused no substantial film thickness increase in the base oxide film located underneath the HfO$_2$ film.

While the reason why such an effect is obtained is not completely understood at the present juncture, there is a possibility that the nitrogen atoms contained in the source material cause segregation to the grain boundaries in the HfO$_2$ film and cause a pinning effect against the migration of oxygen atoms or Hf atoms. The amount of the nitrogen atoms is confirmed to be 0.5–5 atomic percent.

Figure 8:
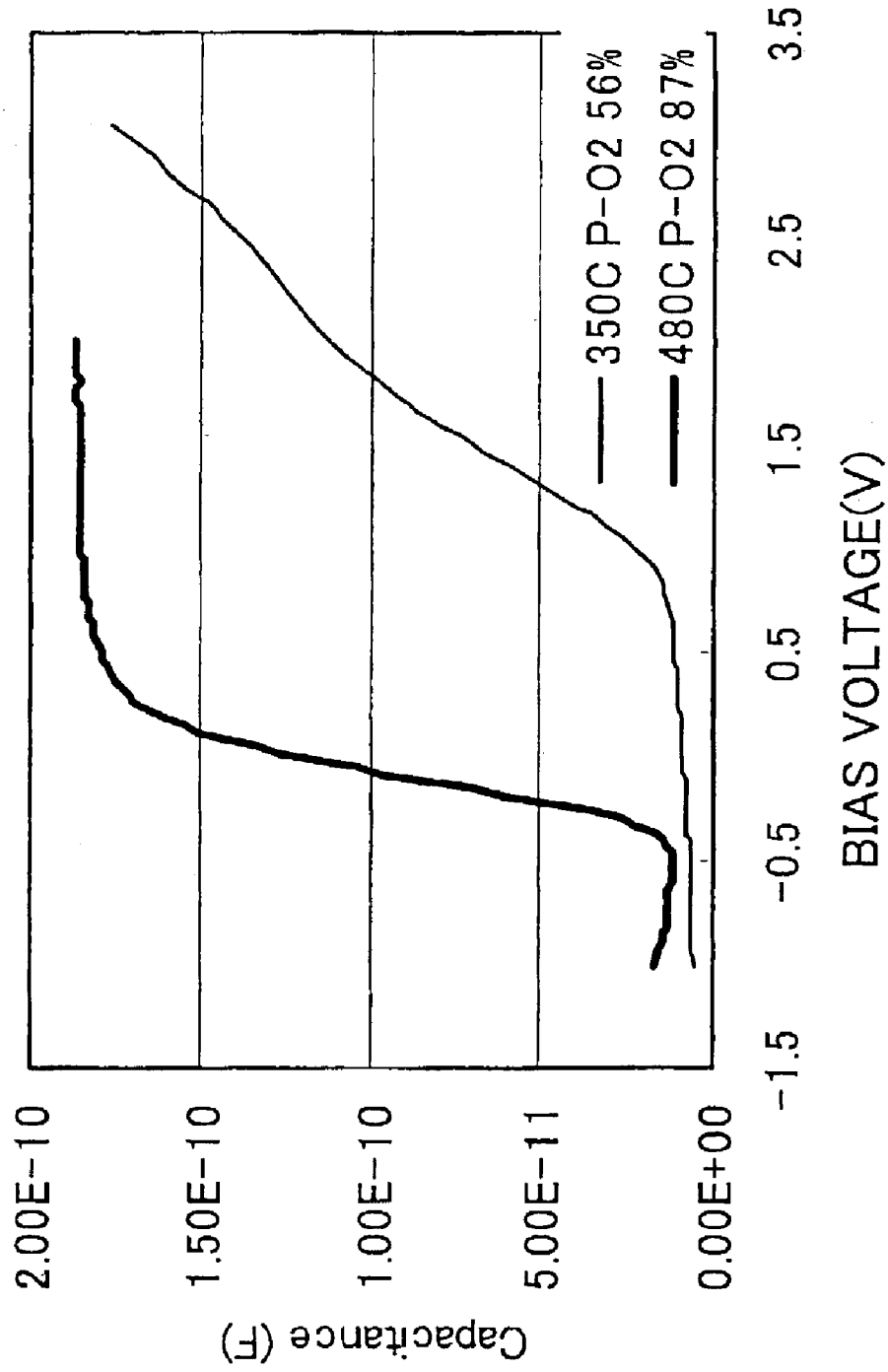
FIG. 8 is a diagram showing a C-V characteristic of the $HfO_2$ film obtained by the first embodiment.

FIG. 8 shows the result of a C-V measurement conducted on a capacitor formed by the HfO$_2$ film obtained by the deposition process at 480° C. It should be noted that FIG. 8 also shows the C-V effect for the HfO$_2$ film deposited at 350° C. It should be noted that the deposition of the HfO$_2$ film at 480° C. was conducted with the oxygen concentration level of 87%, while the deposition of the HfO$_2$ film at 350° C. was conducted while setting the oxygen concentration level to 56%.

Referring to FIG. 8, excellent C-V characteristic of small leakage current is obtained in the case the HfO$_2$ film is deposited at the substrate temperature of 480° C. and the oxygen concentration level of 87%. In the case the HfO$_2$ film is deposited at the substrate temperature of 350° C. and the oxygen concentration of 56%, on the other hand, the HfO$_2$ film shows unwanted characteristics of large leakage current. It is believed that this difference is caused in correspondence to the different impurity concentration level between these two films.

Figure 9:
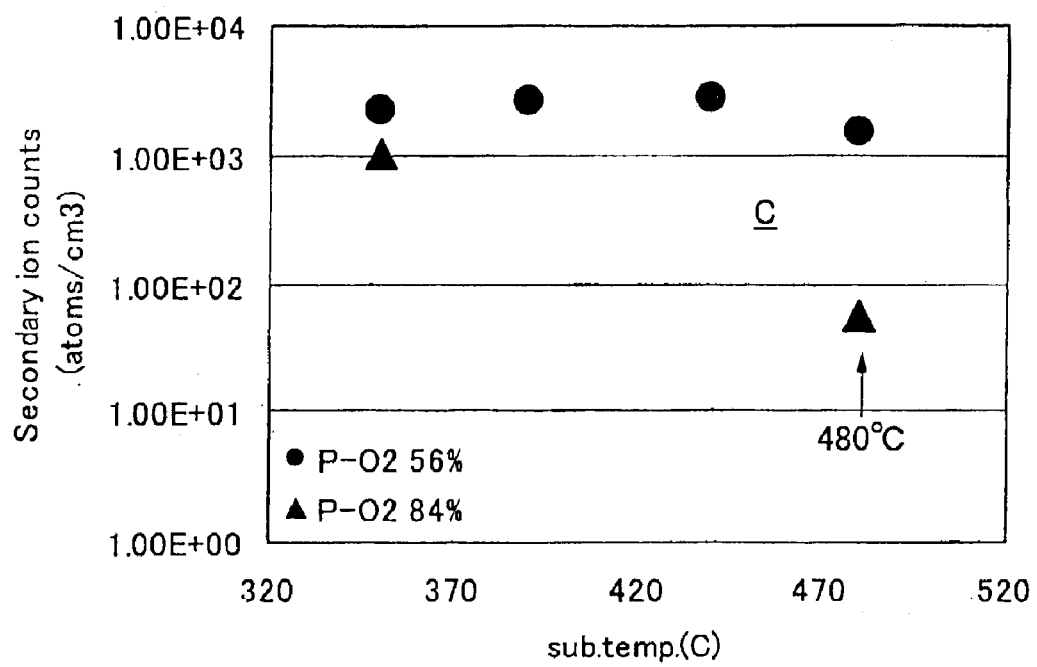
FIG. 9 is a diagram showing a carbon concentration in the $HfO_2$ film obtained by the first embodiment.

FIG. 9 shows the carbon concentration in the HfO$_2$ film deposited at various substrate temperatures in the range of 350–480° C.

Referring to FIG. 9, it can be seen that the carbon concentration level in the film exceeds $1 \times 10^3/cm^3$ in any of the HfO$_2$ films deposited under the condition of 56% oxygen concentration level, irrespective of the substrate temperature. In the case the HfO$_2$ film is deposited under the conduction of oxygen concentration level of 84%, and particularly in the case the deposition is conducted at the substrate temperature of 480° C., on the other hand, it can be seen that the carbon concentration level in the film becomes $1 \times 10^2/cm^3$ or less, and it is believed that this contributes to the C-V characteristics of FIG. 8. It is thus believed that the C-V characteristics of FIG. 8 reflects the reduction of residual carbon achieved in the HfO$_2$ film deposited from a Hf[N(C$_2$H$_5$)$_2$]$_4$ source for the case the deposition is conducted under high temperature and high oxygen concentration environment.

Figure 10:
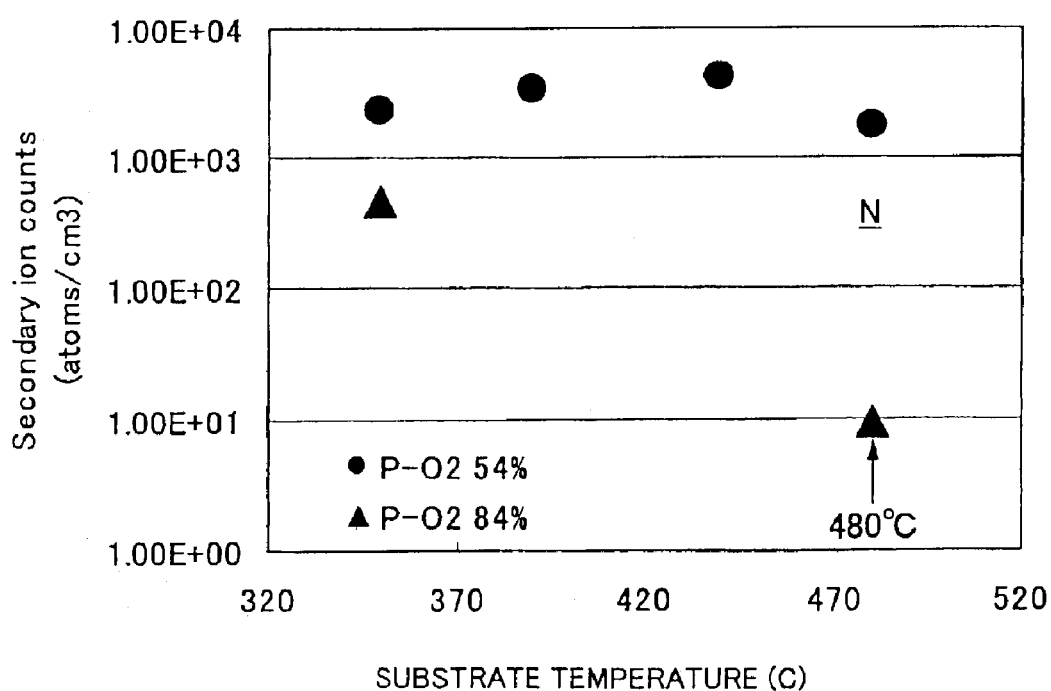
FIG. 10 is a diagram showing a nitrogen concentration in the $HfO_2$ film obtained by the first embodiment.

FIG. 10 shows the nitrogen concentration in the HfO$_2$ film deposited at various substrate temperatures in the range of 350–480° C.

Referring to FIG. 10, it can be seen that the nitrogen concentration exceeds $1 \times 10^3/cm^3$ in the HfO$_2$ film deposited under the oxygen concentration level of 56%, irrespective of the substrate temperature, while in the HfO$_2$ film deposited under the oxygen concentration level of 84%, and particularly in the HfO$_2$ film deposited at the substrate temperature of 480° C., it can be seen that the nitrogen concentration level in the film is $1 \times 10^2/\text{cm}^3$ or less. It is believed that this is caused by the fact that the Hf—N bond in the Hf[N(C$_2$H$_5$)$_2$]$_4$ having the structural formula

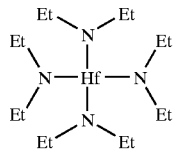

is easily cut by heat and the fact that the Hf[N(C$_2$H$_5$)$_2$]$_4$ source material does not contain oxygen.

Thus, in the present invention, the film thickness increase of the base oxide film is effectively suppressed in any of the deposition process of the metal oxide film or the thermal annealing process of the deposited metal oxide film, by using a metal organic compound containing an amide group such as Hf[N(C$_2$H$_5$)$_2$]$_4$, even in the case the deposition of the metal oxide film is conducted such that there is caused a deposition of the metal oxide film in the crystallized state. Further, grain growth in the film is suppressed also in the thermal annealing process of the metal oxide film, and the interface morphology between the metal oxide film and the thin base oxide film is stabilized. Further, by conducting the deposition under high temperature and high oxygen concentration environment, it becomes possible to minimize the concentration of the impurity element contained in the film.

[Second Embodiment]

FIGS. 11A–11E show the fabrication process of a semiconductor device according to a second embodiment of the present invention.

Figure 11A:
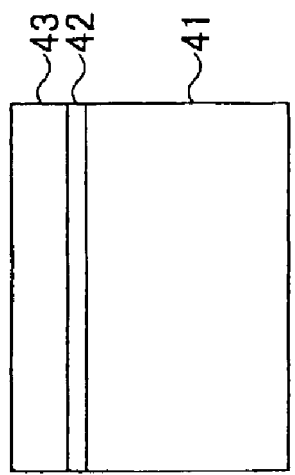
FIGS. 11A–11E are diagrams showing the fabrication process of a semiconductor device according to a second embodiment of the present invention.
Figure 11B:
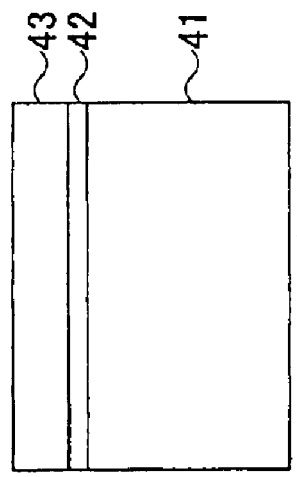

Referring to FIG. 11A, a base oxide film 42 formed of an SiO$_2$ film or an SiON film having a thickness of 1 nm or less is formed on a silicon substrate 41 by conducting a radical oxidation processing that uses ultraviolet-excited oxygen radicals, or alternatively by conducting a plasma radical nitriding processing subsequently to the radical oxidation processing. Next, in the step of FIG. 11B, a metal oxide film 43 of HfO$_2$, ZrO$_2$, or the like, is deposited on the base oxide film 42 by conducting a metal organic chemical vapor deposition (MOCVD) process that uses a metal organic source containing an amide group, such as Hf[N(C$_2$H$_5$)$_2$]$_4$, Hf[N(CH$_3$)$_2$]$_4$, Zr[N(C$_2$H$_5$)$_2$]$_4$, Zr[N(CH$_3$)$_2$]$_4$, or the like, at the substrate temperature of 400–600° C. and under the oxygen concentration level of 80% or more, such that the metal oxide film is deposited in the crystallized state.

Figure 11C:
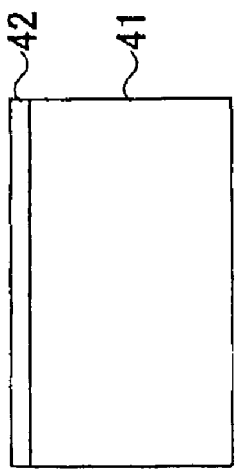

Next, in the step of FIG. 11C, the structure thus obtained is annealed at the temperature of 500–700° C. in a nitrogen atmosphere such that the metal oxide film 43 is thoroughly crystallized. Thereby, it should be noted that the metal oxide film 43 is already crystallized in the state immediately after the deposition. Further, the nitrogen atoms in the source material are segregated to the grain boundaries. Thus, the growth of the crystal grains in the metal oxide film 43 is suppressed, and the increase of film thickness by the residual oxygen of the base oxide film is suppressed. Particularly, the increase of the base oxide film 42 in the steps of FIG. 11B and 11C can be substantially avoided by forming the base oxide film 42 by a SiON film.

Figure 11D:
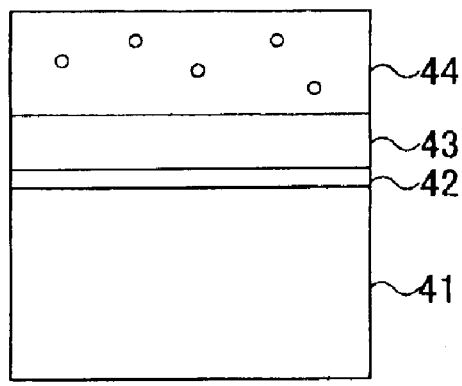
Figure 11E:
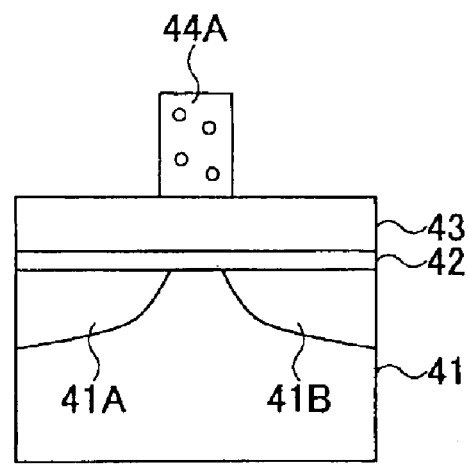

Next, in the step of FIG. 11D, a polysilicon film 44 is deposited on the metal oxide film 43, followed by a patterning process in the step 11E, and there is formed a gate electrode 44A. Further, by conducting ion implantation process while using the gate electrode 44A as a mask, diffusion regions 41A and 41B are formed in the silicon substrate 41 at both lateral sides of the gate electrode 44A.

According to the present invention, it is possible to reduce the thickness of the gate oxide film, formed of the base oxide film 42 and the metal oxide film 43, in correspondence to the reduction of the gate length, and a semiconductor device operable at a very high speed is obtained.

Further, the present invention is not limited to the embodiments described heretofore, but various variations and modifications may be made without departing from the scope of the invention.

The present invention is based on Japanese priority patent application 2002-178930 filed on Jun. 19, 2003, the entire contents of which are incorporated herein as reference.

What is claimed is:

1. A method of fabricating a semiconductor device, comprising:

forming a gate insulation film on a substrate, said step of forming said gate insulation film comprising the steps of depositing a metal oxide film on said substrate by supplying an organic metal source containing an amide group to said substrate while holding said substrate at a predetermined temperature, said temperature being chosen such that cleavage of a metal-nitrogen bond in said organic metal source is suppressed, such that said metal oxide film contains nitrogen at a predetermined concentration and such that said metal oxide film has a microcrystalline form.

2. The method of claim 1, wherein said metal oxide film contains Hf or Zr.

3. The method as claimed in claim 1, wherein said metal oxide film is deposited at a substrate temperature of 400–600° C.

4. The method as claimed in claim 1, wherein said organic metal source is selected from the group consisting of Hf[N(C$_2$H$_5$)$_2$]$_4$, Hf[N(CH$_3$)$_2$]$_4$, input highlighted portion leftout and ZR[N(CH$_3$)$_2$]$_4$.

5. The method as claimed in claim 1, wherein said metal oxide film is formed of microcrystals having a grain diameter of 10 nm or less immediately after said deposition.

6. The method as claimed in claim 1, further including annealing said deposited metal oxide film, said metal oxide film being formed of microcrystals having a grain diameter of 10 nm or less after said annealing.

7. The method as claimed in claim 1, wherein said metal oxide film contains nitrogen within a range of 5 atomic percent or less.

8. The method as claimed in claim 1, wherein said step of depositing said metal oxide film is conducted in an ambient atmosphere containing oxygen, wherein said concentration of nitrogen is controlled by a concentration of oxygen in said ambient atmosphere.

9. The method as claimed in claim 8, wherein said concentration of oxygen is 80% or more.

10. The method as claimed in claim 1, wherein said step of depositing said metal oxide film is conducted in ambient atmosphere containing oxygen, wherein a concentration of carbon in said metal oxide film is controlled by a concentration of oxygen in said ambient atmosphere.

11. The method as claimed in claim 10, wherein said step concentration of oxygen is 80% or more.

* * * * *